United States Patent [19]
Macovski

[11] Patent Number: 5,291,138
[45] Date of Patent: Mar. 1, 1994

[54] ROTATING FRAME IMAGING SYSTEM
[76] Inventor: Albert Macovski, 2505 Alpine Rd., Menlo Park, Calif. 94025
[21] Appl. No.: 884,757
[22] Filed: May 18, 1992
[51] Int. Cl.$^5$ .............................. G01V 3/00
[52] U.S. Cl. ................... 324/309; 324/307
[58] Field of Search ............ 324/309, 307, 300, 311, 324/312, 313, 314

[56] References Cited
U.S. PATENT DOCUMENTS
4,703,274 11/1987 Kaufman et al. ............ 324/309

Primary Examiner—Louis Arana

[57] ABSTRACT

Following the polarizing of the magnetic moments in an object using a pulsed field the moment distribution is imaged in the rotating frame by exciting the magnetic moments using a radio-frequency gradient field and a radio-frequency bias field whose phase is cyclically oscillated to prevent the loss of signal due to inhomogeniety. To increase the signal-to-noise ratio coils are used to pick up the signals at quadrature positions. A constant gradient is used for spatial selectivity through saturation.

26 Claims, 10 Drawing Sheets

ROTATING FRAME IMAGING SYSTEM

BACKGROUND OF THE INVENTION

1. Field of the Invention

This invention relates primarily to magnetic resonance imaging systems. In a primary application this invention relates to the use of radio frequency fields, including gradients to rotate the magnetic moments while receiving signals in the rotating frame.

2. Description of the Prior Art

Magnetic Resonance Imaging has become one of the wider-used modalities in the field of medical imaging. A descriptive series of papers on NMR imaging appeared in the June 1980 series of the IEEE Transactions on Nuclear Science, Vol. NS-27, pp. 1220-1255. The basic concepts are covered in the lead article, "Introduction to the Principles of NMR" by W. V. House, pp. 1220-1226.

In general, in a MRI imaging system, the object being studied is within a highly-uniform intense static magnetic field. The object is then excited by a high-power radio frequency burst which causes the magnetic moments in the object, which were lined up with the static field, to precess normal to the static field. Using spatially orthogonal gradients, these magnetic moments become spatially varying. A receiver coil picks up the signals from the precessing moments. This signal is processed to create images of the magnetic moment density in the object.

These systems have a large number of theoretical and practical problems. The resulting costs are quite high since a highly uniform magnet is required over a relatively large volume. Also, a high-power radio frequency transmitter is required which must be uniformly distributed over the object and must avoid any excessive heating effects. Anything in the object which modifies the magnetic field, such as materials within the body which have changes in magnetic susceptibility, can seriously distort the image. Slightly differing magnetic resonances from different materials, primarily water and fat, become translated from each other, distorting the image. Also, many solid materials cannot be imaged since, in the presence of a strong polarizing field, the take on very short decay times. MRI machines cause loud sounds when the gradient coils are excited in the presence of a static magnetic field. Another practical difficulty with existing instruments is that high-power wide bandwidth amplifiers are required to run the gradient coils.

Efforts at increasing the SNR (signal-to-noise ratio) of NMR images usually involve increasing the magnetic field strength. However, in existing systems this ability is quite limited. If the field is increased, the r.f. excitation frequency must also be increased, greatly aggravating the r.f. heating problem. Also, the penetration of the r.f. signal on both the transmit and receive modes becomes a serious problem.

Perhaps the most important of the economics is that MRI, despite its almost ideal lack of toxicity and radiation, is not used for mass screening for any disease because of the prohibitive costs involved.

One attempt at a simpler system is given in a paper by J. Stepisnik, M. Kos, and V. Erzen in Proc. of XXII Congress Ampere, Roma, 512, 1986. Here the magnetic field is pulsed and then the magnetic moments are allowed to line up in the earth's field. Following this, an r.f. excitation is used to rotate the moments, with a set of gradients in the sane direction as the earth's field used to create an image. This system has marginal performance, given the very weak gradients, and limited economic advantage, since r.f. excitation is required. A non-imaging system, without any r.f. excitation, was used to measure the earth's field using NMR. This system is described in Phys. Rev., A94, 941, (1954). Here a water sample is subjected to a pulsed field normal to the earth's field. The pulse is shaped so that the magnetic moments remain in the direction of the pulsed field when it turns off. Following the pulse, the precession frequency due to the earth's field is measured to determine the earth's field. This system used no gradients and did not provide imaging.

U.S. Pat. No. 5,057,776 by the applicant, disclosed a system using a pulsed field to polarize the moments followed by a bias and gradient fields in quadrature to cause precession. No rf excitation was required. A recent application by the applicant entitled PULSED FIELD MRI SYSTEM WITH SPATIAL SELECTION introduced slice-selection mechanisms for this system. A copending application by the applicant on this same system entitled MRI IMAGING SYSTEM USING A PERIODIC BIAS FIELD introduced a cyclical bias field for further immunity to inhomogeniety.

A few papers have been written on the general subject of using the rotating frame of the NMR system to provide imaging. An early paper by D. I. Hoult (J. Magn. Reson., vol 33, p. 183, 1979) used the rotating frame to provide spatially selective excitation, with the readout done in conventional fashion. S. J. Cox and P. Styles (J. Magn. Reson., vol 40, p. 209, 1980) used rotating rf gradients for chemical shift imaging. The most direct use of rotating frame imaging came in a paper by F. De Luca (Lettere Al Nuovo Cimento, vol 39, p. 390, 1984) in which he suggested the use of three dimensional rf gradients plus an rf bias field and imaging in the presence of the rf excitation. This system has never been used or tried for a number of reasons. At normal magnetic fields, the rf power deposition would be excessive and far beyond present standards. If the static magnetic field is reduced to a lower level to avoid rf heating, the SNR would be unacceptably low. Also, the system is susceptible to both rf and static field inhomogeniety making it difficult to construct. Finally, the system described showed no method of selective excitation to limit the imaging volume.

In the early pre-imaging era of MRI the concept of "rotary echoes" was introduced which is related to the general problem of inhomogeniety, a subject of this application. This is described in a paper by I. Solomon in Phys. Rev. Letters, vol. 2, p. 301, 1959. The material is repeated in Ch. III p. 70 of A. Abragam, Principles of Nuclear Magnetism, Oxford Press, reprinted 1985. Here the rf field $B_1$ is reversed at specific times to create a sequence of echoes when the moments return to the z axis. As indicated, this is a non-imaging experiment without gradients.

SUMMARY OF THE INVENTION

An object of this invention is to produce MRI images of an object, such as the body, with immunity to variations in the magnetic fields.

A further object is to produce MRI images in an economical fashion with a relatively high signal-to-noise ratio.

A further object of this invention is to provide high quality MRI images at relatively high speed.

Briefly, in accordance with the invention, a pulsed magnetic field is applied to an object, polarizing the magnetic moments. The polarized moments are driven in the rotating frame using an rf bias field and RF gradient fields. The rf bias field has a cyclical amplitude with a zero average value to prevent phase error buildup due to inhomogeniety. The received signals are demodulated using demodulation signals based on the frequency of the cyclical bias field. Signals can be received from a limited volume using a static gradient plus saturation excitation.

BRIEF DESCRIPTION OF THE DRAWINGS

For a more complete description of the invention reference can be made to the following detailed description of several illustrative embodiments thereof which is given in conjunction with the accompanying drawings of which:

FIG. 10b is a graph illustrating the cosinusoidal signal component resulting from the bias waveform of FIG. 10a;

FIG. 10c is a graph illustrating the sinusoidal signal component resulting from the bias waveform of FIG. 10a;

DESCRIPTION OF THE PREFERRED EMBODIMENT

Figure 1:
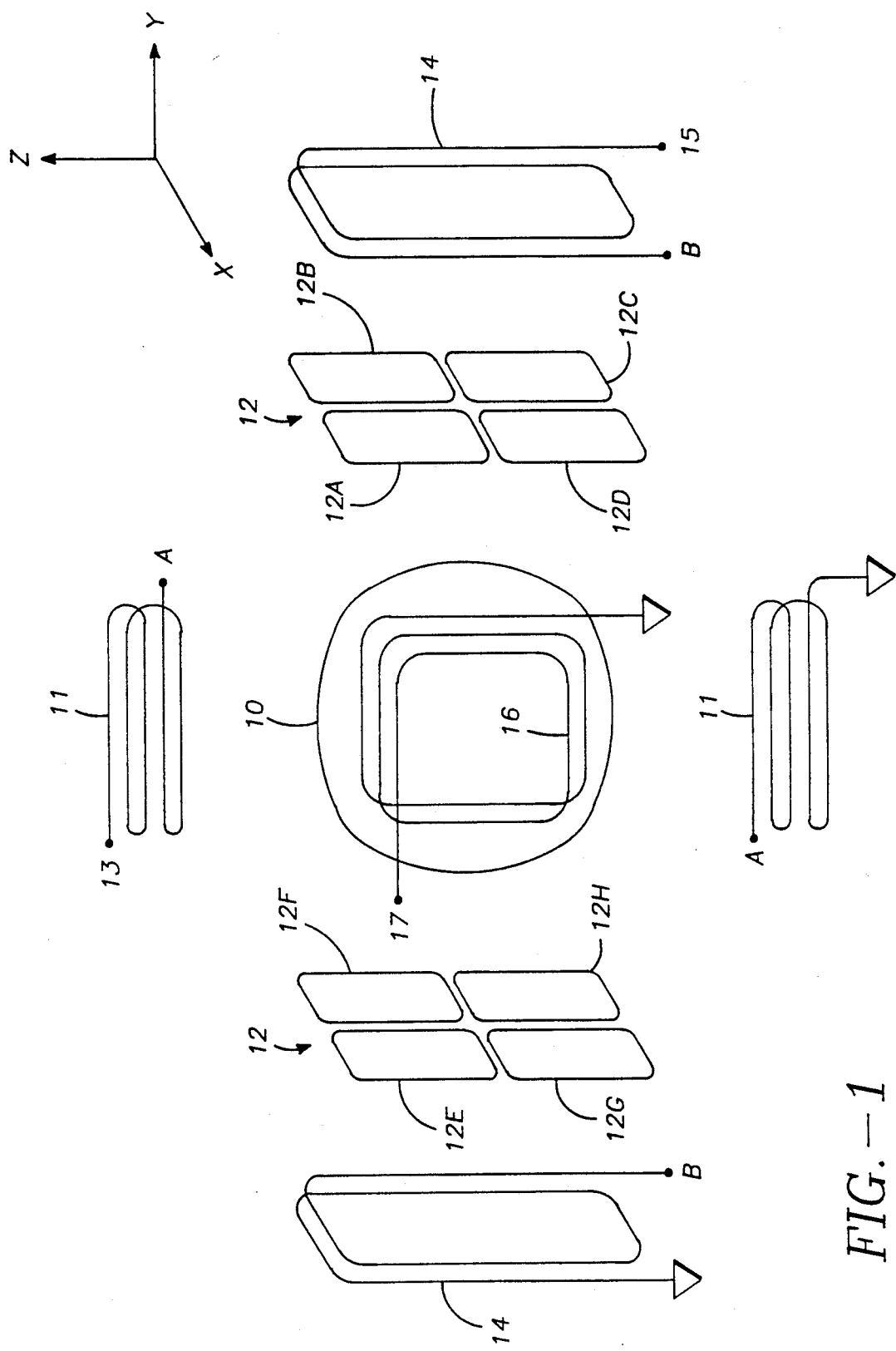
FIG. 1 is a schematic diagram illustrating an embodiment of the invention.

An understanding of the broad aspects of the invention may best be had by reference to FIG. 1. Here it is desired to create a magnetic resonance image of object 10, which is often a portion of the human body. To provide magnetic resonance the magnetic moments are polarized. This can be accomplished by using coils 11 as an electromagnet by applying a d.c. current to 13, with the A terminals connected. Alternatively, the same field in the z direction can be created with a permanent magnet, not shown. In existing MRI systems, following polarization, the moments are tipped into the xy plane with rf excitation, and then read out in the absence of rf excitation as they precess about the z axis. Here the moments are driven by an rf field and continuously read out in the presence of the rf field. As will be shown, if done properly this can provide significant cost reductions and performance improvements.

We first assume that, as previously stated, signal 13 is a d.c. current energizing the magnet. Coil systems 14 and 12 supply the rf for the rotating frame imaging, with terminals B connected. Coil 14 provides the bias field $B_1(t) \cos 2\pi f_0 t$ which causes the moments to rotate about the y axis at the frequency $\gamma B_1$, where $\gamma$ is the gyromagnetic ratio based on the classic Lamor relationship $$f = \gamma B.$$

The frequency $f_0$ is the resonant frequency corresponding to the static magnetic field $B_z$ produced by coils 11. Thus, due to the static and rf fields, the moments will be rotated as stated. To provide imaging, we make this rotation spatially varying using rf gradients, and receive the resultant signal. The gradient coils are shown as 12 A-F. These are driven with rf and supply all of the spatially varying field components while the fields point in the y direction. Driving coils A, B, C, and D with one polarity of rf signal, and E, F, G and H with the other will produce a $G_y$ rf gradient field. Similarly, driving A, B, E and F with one polarity and C, D, G and H with the other will provide a $G_z$ gradient. Finally, driving coils A, D, E and G with one polarity and B, C, F and H with the other will provide a $G_x$ gradient.

As is widely known, the spatial frequency k received at any time is based on the integral of the gradient waveform. Thus a set of gradient waveforms can be sequentially applied to coils 12 to cover the desired region of k space corresponding to the desired image of object 10. The resultant signal 17 due to the rotating moments are picked up in coil 16. This is then processed, by filling k space and forming a 3D image of object 10. This is the essence of the previously referenced paper by De Luca.

Although operable, this approach has a number of severe problems which render it of little value. Firstly, the rf signals are on for much longer times than in present MRI and would far exceed the rf heating limits for medical use with humans. This can be remedied by making the $B_z$ field very low, resulting in a low excitation frequency which avoids excessive rf heating. This then results in a very poor image with very low (SNR) signal-to-noise-ratio, or excessively long imaging time, or both. Also, the system would be very sensitive to inhomogeniety of the rf and static magnetic fields. This prevents the use of inexpensive simple systems having a variety of geometries. It forces the use of very large complex coils that totally surround the patient which are expensive and cause claustrophobia. In addition, the system shown requires imaging the entire 3D space of object 10 since no mechanism is shown to selectively excite a part of the object. This can also result in aliasing if insufficient sampling is used.

Figure 2:
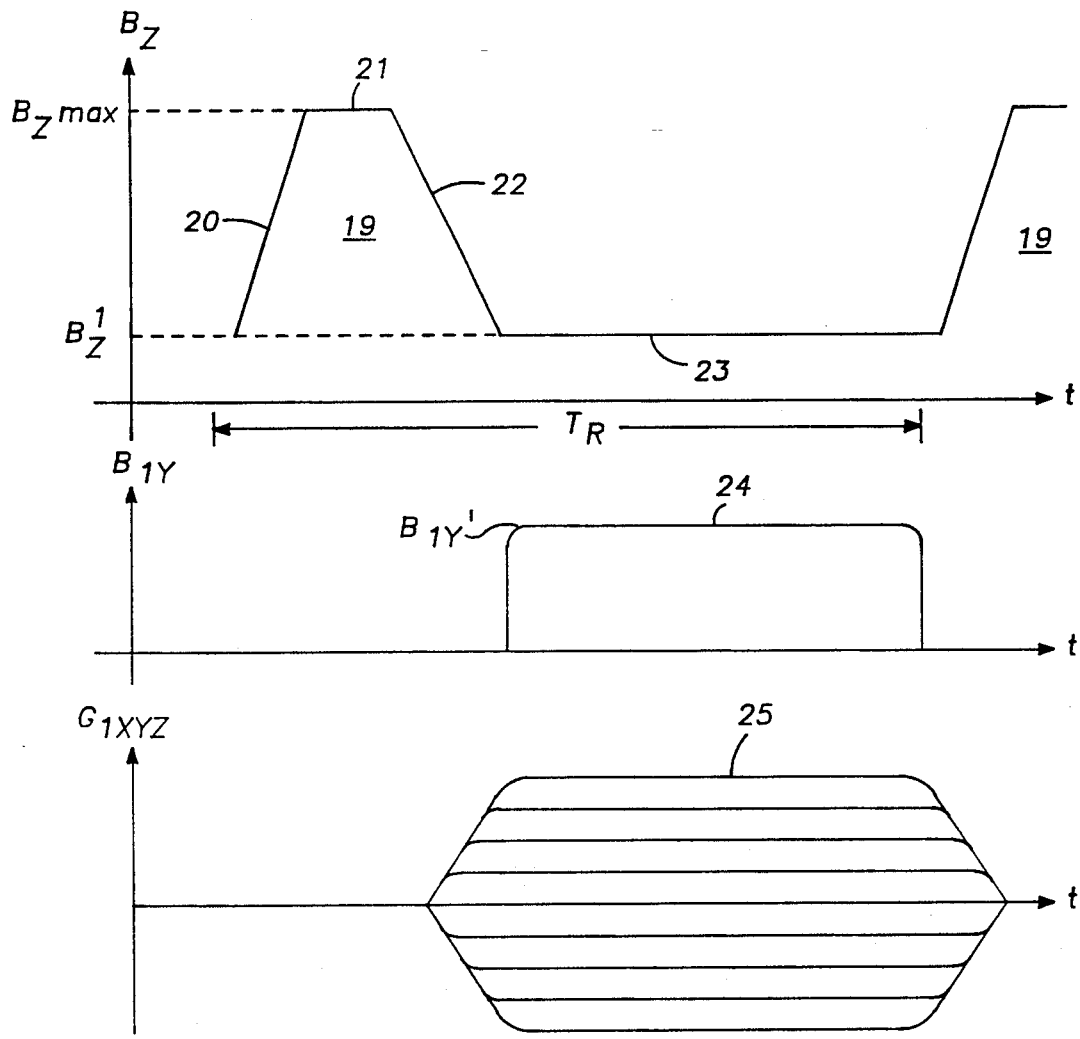
FIG. 2 is a set of graphs used in an embodiment of the invention.

The new approach is illustrated in FIG. 2. To avoid the rf heating problem and SNR problem of the previous system the magnetic moments are polarized using a pulsed polarizing field to coil 11 creating field $B_z$. As shown, pulse 19 is used to polarize the moments at a relatively high magnetic field to provide good SNR in a reasonable imaging time interval. The pulse rise takes place in time interval 20 and falls in time interval 22. During each of these intervals the slopes should be limited to avoid excessive dB/dt which can induce undesirable currents in the body. During time interval 21 the magnetization or polarization builds up at a rate determined by $T_1$. If left on for a time long as compared to $T_1$ of all materials involved, then all materials would reach their maximum magnetization. If interval 21 is left on for a shorter time, the resultant magnetization will have different amounts of $T_1$ dependence, providing additional image contrast. Following the pulse, the value of $B_z$ remains at 23, $B_z'$, during the time the spins are rotated and signals are received. An alternate approach to providing this field is the use of a combination electromagnet and permanent magnet for coils 11 where the electromagnet provides pulse 19 and the permanent magnet provides the bias field $B_z'$.

During this time period, following pulse 19, an rf bias field $B_{1y}$ is created, as shown in FIG. 2, by applying signal 24, a constant rf field, to terminal 15 of coils 14. This rf field, at the nominal resonant frequency $\gamma B_z'$, causes the magnetic moments to rotate about the y axis. During the same time interval, rf gradients 25, applied to the coils 12 as previously described, are used to provide imaging by scanning through k-space as is well known in the art and described in the previously referenced publications. For simplicity, the amplitude of the gradients which modulate the rf signal are shown rather than the total rf envelope. Thus the gradients shown represent the signal $G_1 \cos 2\pi\gamma B_z' t$ where $G_1$ is the amplitude of the modulated wave. In general the subscript 1 is used to designate the rf amplitude.

As shown in FIG. 2, waveform 25 represents the amplitudes of rf signals applied in sequence to all three gradient axes. For example, $G_{1x}$ can be given one value while the other two are sequenced through their values. This provides a 3D scan of k-space consisting of radial lines in all three spatial dimensions. Any of the known 3D k-space scans can be used. Additional approaches to gradient waveforms will be described. In addition, the general subject of an oscillating bias will be subsequently described.

What is most important is that this system can be made high performing without excessive heating. The amplitude and duration of pulse 19 determines the degree of magnetization and thus the SNR. However, the frequency of the bias and gradient fields are determined solely by the highly reduced field 23 or $B_z'$. This can be made very low and thus completely avoid the rf heating problem without sacrificing SNR or speed.

Figure 3:
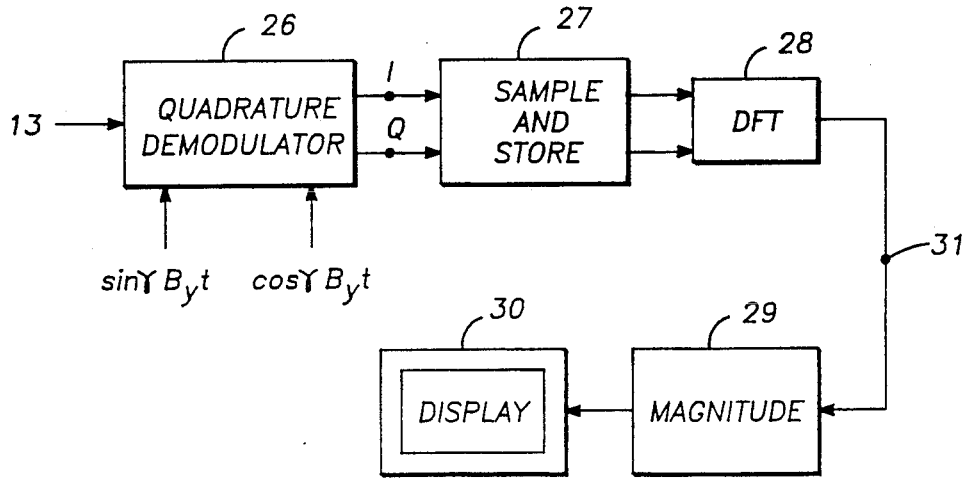
FIG. 3 is a schematic drawing of the receiver and processor functions in an embodiment of the invention.

The signal information lies in the rotating magnetic moments as driven by the rf signals. Thus the received signal represents variations in $M_z$, the magnetic field in the z direction. One convenient method of receiving the signal is to use coils 11, the same one used to provide the $B_z$ field, to provide the signal on terminal 13. Alternatively, additional coils can be used. These can either be a conventional winding, or be the coil portion of a squid pickup using a superconductive device. The latter has improved SNR for relatively low frequencies. As shown in FIG. 3, signal 13 is applied to quadrature demodulator 26 containing sine and cosine demodulating signals at the frequency of the rotating moments $\gamma B_{1y}'$. This demodulator contains the usual low-pass filter, not shown, so that carrier components do not appear in the output. The resultant I and Q signals, representing the inphase and quadrature components of each point in k-space, are stored in sample and store system 27. These stored values are then applied to discrete Fourier Transform system 28 providing image signal 31. This can be used directly with display 30. Alternatively, as shown, a magnitude operation 29 can be applied to the complex values in 31 to provide some immunity to phase errors.

Figure 4:
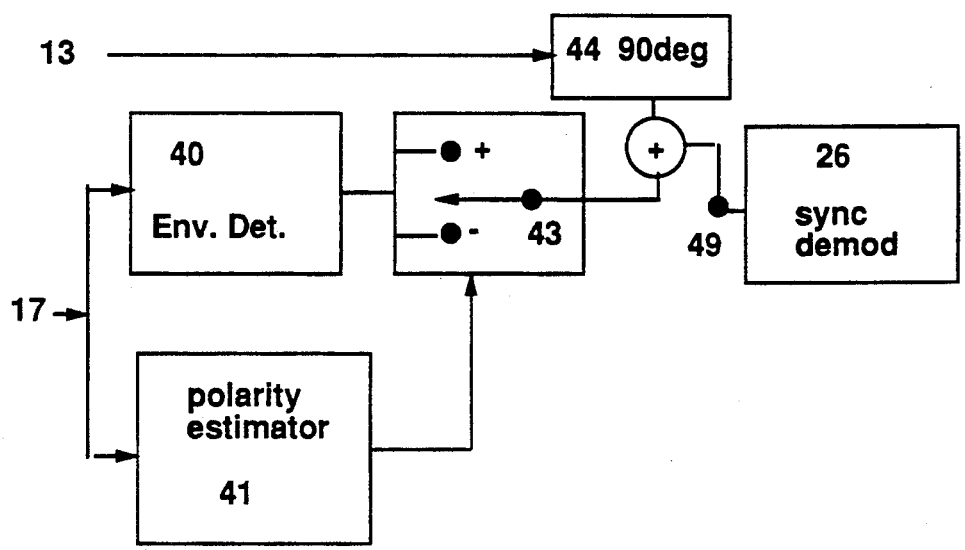
FIG. 4 is a schematic diagram of an embodiment providing higher SNR.

Existing MRI systems often use quadrature receiving systems to increase the SNR. This can also be used with this system as shown in FIG. 4 using additional signal 17 from coil 16. The basic difficulty is that, although the z component of the field is the desired signal of the general form $B_1(t)\cos 2\pi\gamma B_{1y}'t$, signal 17 will have this same signal modulating a carrier at the frequency $\gamma B_z'$. Since we are dealing with inhomogeniety, this will be a relatively unstable signal due to spatial variations in $B_z'$. This is taken into account in FIG. 4 where signal 17 is envelope detected in 40. The resultant signal has the correct magnitude but arbitrary polarity. It is the applied to polarity switch 43 which provides either a positive or negative version of the envelope. This switch is driven by polarity estimator 4 which finds those regions of signal 17 where the polarity has reversed. This can simply be a frequency discriminator observing regions having a high derivative of the phase, and thus a large frequency spike. Polarity switch 43 can be switched during each such spike in the frequency discriminator waveform. The polarity switched signal is the desired signal in the x axis. It is added to the output of 90 degree phase shifter 44 to provide enhanced signal 49. This signal 49 is applied to demodulator 26 and processed as previously described.

A wide variety of other k-space scans can be used other than that shown in FIG. 2. These are well known in the literature. Here we use solely 3D k-space scans since the entire volume has been excited. These can be made into 2D k-space scans by simply removing the signals from one of the gradient axes. 2D scans can be useful in applications involving imaging the projection of a volume such as with vessel imaging. Other k-space scans are shown in FIGS. 5-8.

Figure 5:
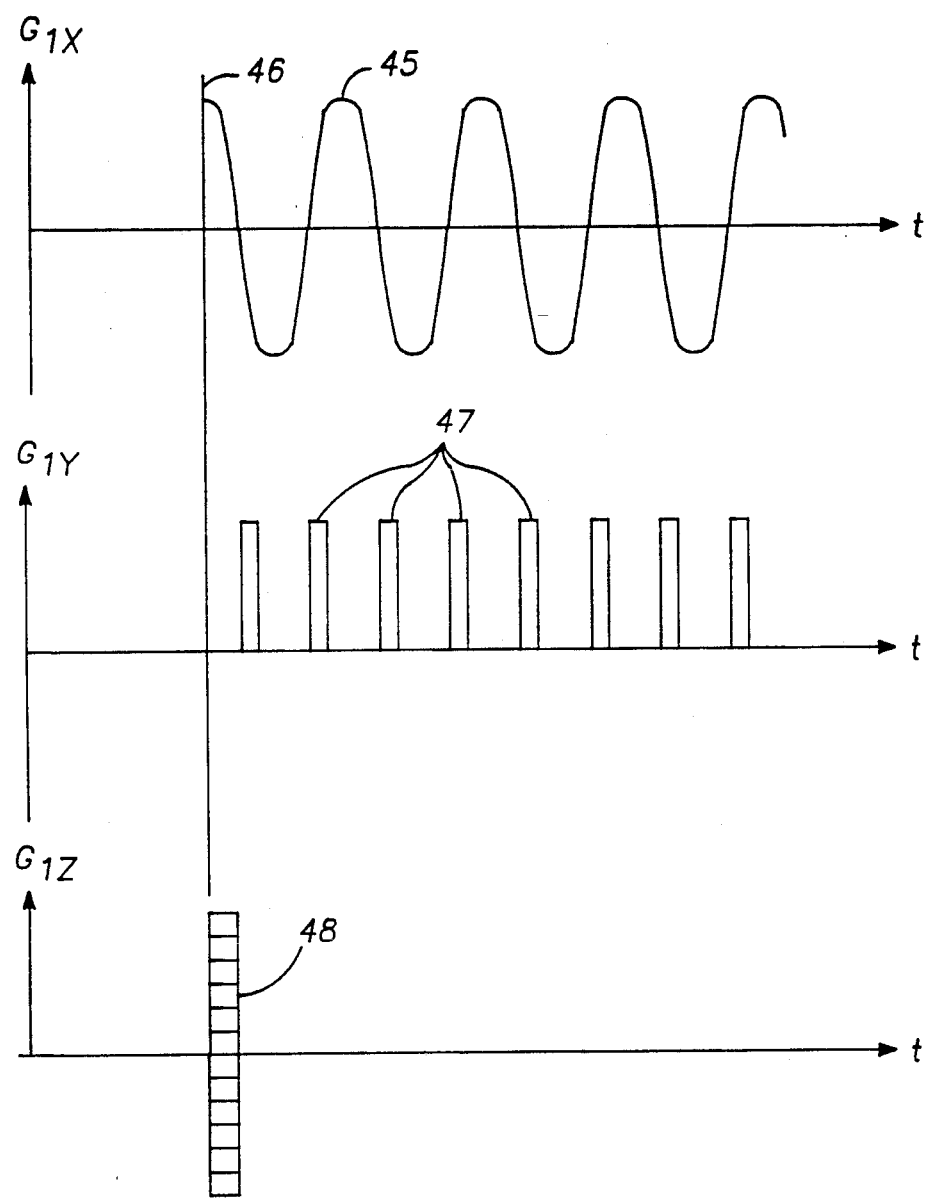
FIGS. 5, 6, 7 and 8 are sets of graphs illustrating alternate gradient embodiments of the invention.

A 3D echo-planer type of k-space scan is illustrated in FIG. 5. The gradient waveforms are initiated at time 49, at the end of the pulse 19. A sine wave or square wave 45 on one axis provides a bilateral scan in $k_x$. A set of blips 47 provides line stepping in $k_y$, and a phase encoding array 48 provides line stepping in $k_z$. Each interval in the phase encode includes a separate pulsed polarization. On completion of the phase encode sequence, all of the 3D information will have been acquired.

Figure 6:
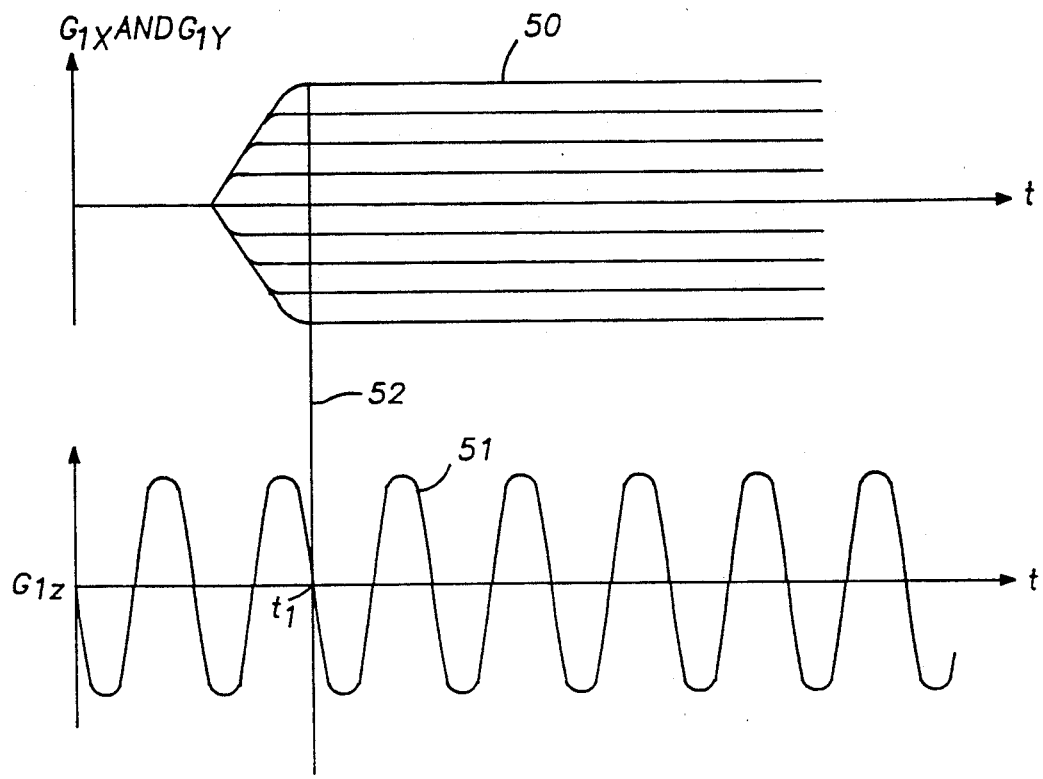
Figure 7:
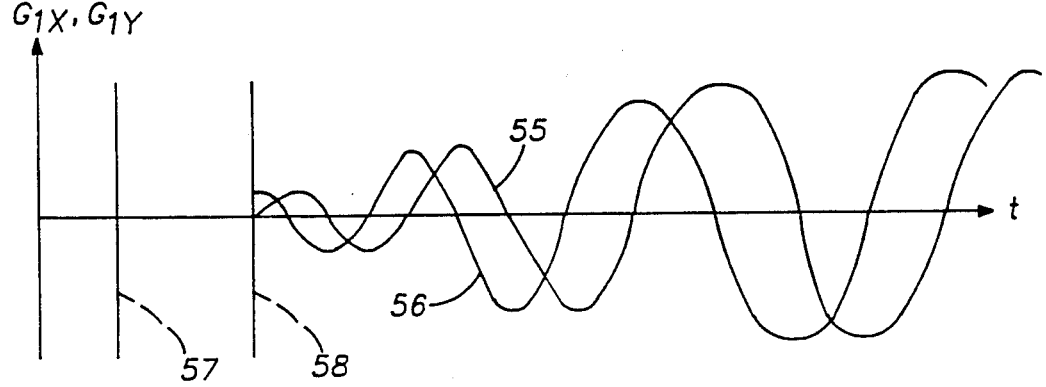

FIG. 6 illustrates an alternate approach to the scan of k-space starting at time 52, the end of pulse 19. Here waveforms 50 provide radial scans of the $k_x$-$k_y$ plane. The $k_z$ dimension is provided by waveform 51 which oscillates at a rapid rate during the radial scans to fully cover k-space. The systems discussed thusfar have had the origin of k-space at the onset of the scan and thus provide images sensitive to the density of the magnetic moments. What is often desired is sensitivity to relaxation times for greater contrast between various organs. As indicated in the previous references, the time constant in the rotating frame is $2T_1T_2/(T_1+T_2)$. This has the desirable trait of responding to both $T_1$ and $T_2$ and being relatively long, for SNR reasons. To provide relaxation sensitivity in any of the previous gradient scans, we simply wait a period of time after the onset of $B_{1y}'$ to provide relaxation time. This is illustrated in FIG. 7 where time 57 is the onset of the rotating moments and at time 58 we begin a spiral scan of the $k_x$-$k_y$ space using 55 and 56. The third dimension can be covered using the phase encode sequence 48 of FIG. 5.

Figure 8:
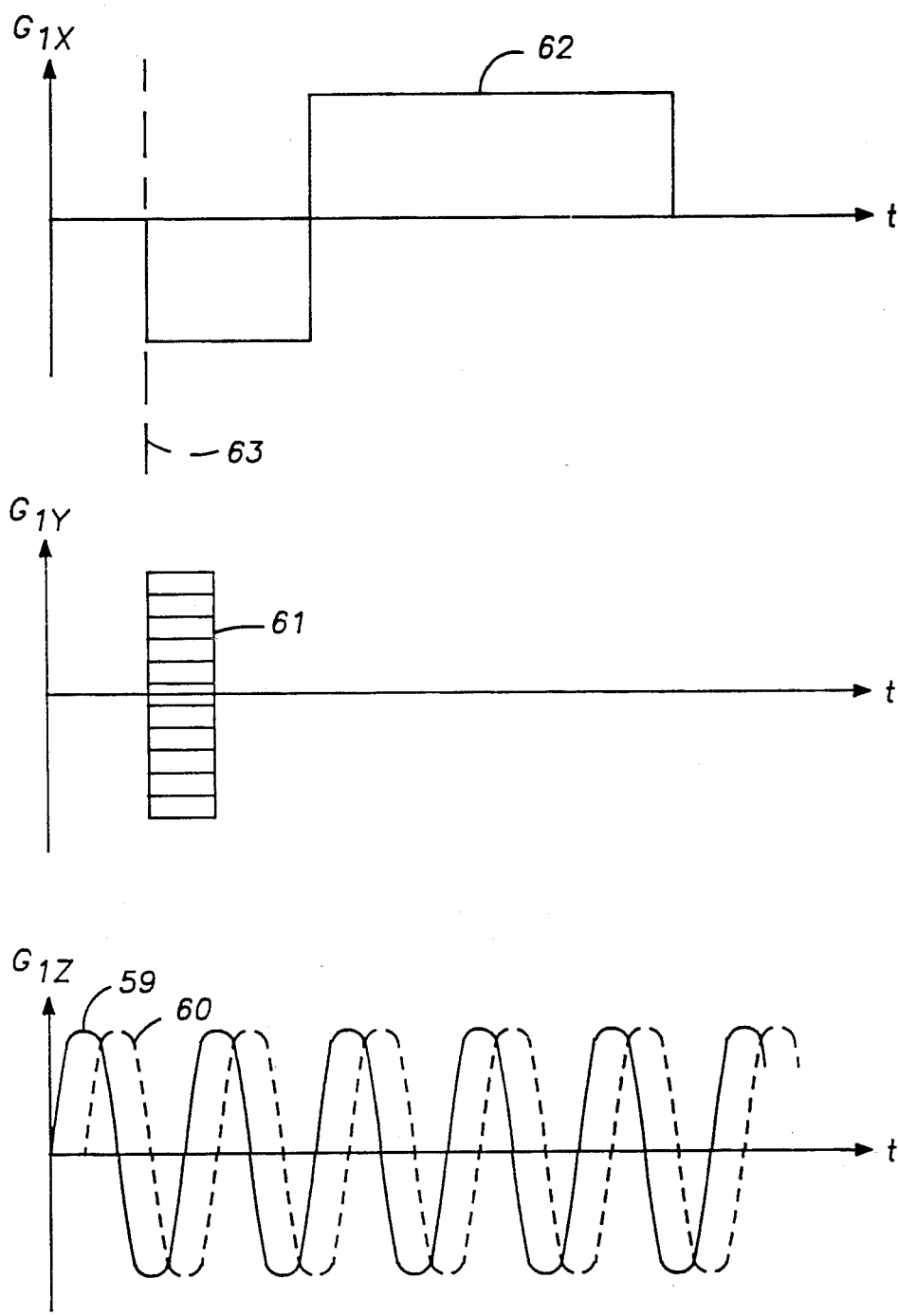

Another k-space scan is shown in FIG. 8 using phase encoding in $k_y$ and scanning in $k_x$. The excitation is initiated at time 63. The $k_x$ scan 62 initially covers negative values and goes through the center of k-space a period of time after excitation begins, providing the desired relaxation sensitivity. The $k_z$ axis can be covered by a rapidly oscillating waveform as shown. To reduce the requirements on the frequency of oscillation, interleaved sequential scans 59 and 60 are used to fully cover k-space in a somewhat longer time.

In many instances it is desirable to return the magnetic moments to equilibrium prior to the next excitation sequence. This can be done by making the area of each gradient waveform zero prior to the onset of the next sequence. This assures that there will be no spatial dependence left over from the previous sequence. Methods of doing this are shown in FIG. 12 of the previously referenced U.S. Pat. No. 5,057,776.

The system as described thusfar has potential problems with magnetic inhomogenieties, especially if a very low cost simple system is to be built. These small low-cost configurations use small coils which can have very non-uniform fields resulting in inhomogenieties. Also, many areas of the body, especially air-filled regions, exhibit susceptibility changes which also result in inhomogenieties of the fields. Errors will be created due to inhomogenieties in either the $B_0$ or $B_1$ fields. The $B_0$ inhomogenieties will be negligible as a result of the small static readout field $B_z'$. Since the $B_0$ inhomogenieties are based on this field, although the percentage variations will be unchanged, the absolute variations are significantly reduced.

Inhomogenieties in the $B_1$ field $B_y$ will also cause decay and signal loss. This can be removed by the novel system shown in FIG. 2a. Here the amplitude of the $B_1$ field is cycled positively and negatively to provide substantially a zero average value. This effectively means that the phase of the $B_y$ rf signal is periodically reversing and that the average carrier value is zero. Physically, the rotating magnetic moments are rotated back and forth rather than being allowed to continuously rotate. If a region or voxel is inhomogeneous, it includes spins rotating at different rates. These will slowly cause dephasing with the resultant integrated signal losing amplitude. If these moments are cyclically caused to change direction, no significant phase buildup is allowed to occur, thus providing immunity to inhomogeniety.

In FIG. 2 the bias field 24 can use an oscillatory bias field instead of the constant bias field shown. This rf bias signal has a trace interval during which the amplitude is at $B_{1y}'$ causing rotation of the moments of approximately one cycle. This is followed by a relatively short retrace interval, having substantially the same area, during which the moments rapidly retrace the same amount. Using this approach there can never be a buildup of phase cancellations and errors due to inhomogeniety since, during each retrace interval, the moments are rephased. Inhomogeniety will therefore simply cause a negligible change in amplitude.

In some cases the waveform may be difficult to generate because of the rapid phase changes required. To alleviate this situation, the trace interval is lengthened to a few cycles, thus minimizing the requirements on the retrace interval. This will not substantially alter the immunity to inhomogeniety since the buildup of phase shifts over a few cycles, such as 2-10 cycles, is very small. Again the retrace interval fully restores the phase coherence.

The demodulation of the received signal, using this oscillatory bias, takes place as previously shown in FIGS. 3 and 4. If desired, the retrace interval can be gated out of signals and 17, but this is not required.

Figure 9:
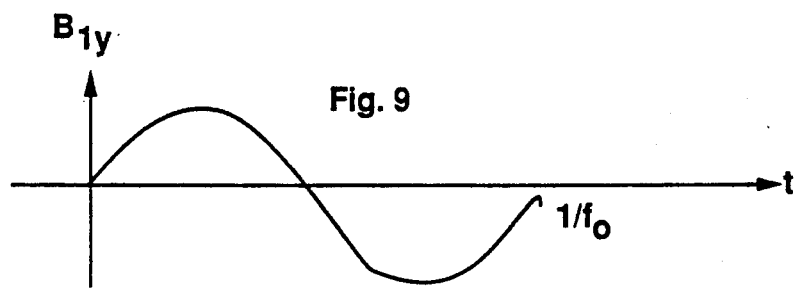
FIG. 9 is a graph illustrating a sinusoidal bias waveform.
Figure 10A:
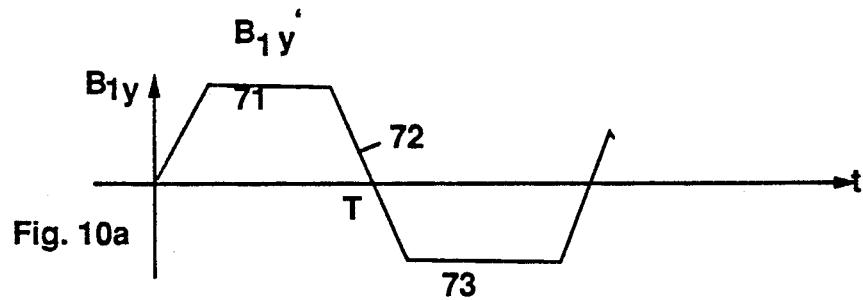
FIG. 10a is a graph illustrating a square wave type of bias waveform.
Figure 10B:
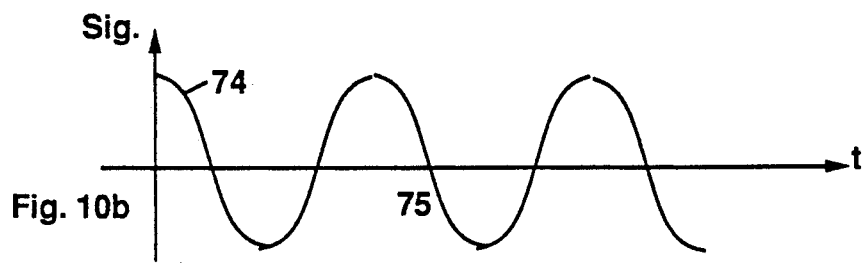

Alternate approaches to oscillatory bias waveforms are shown in FIGS. 9 and 10. FIG. 9 shows sinusoid 70 which causes the angle of rotation of the moments to vary sinusoidally rather than linearly. Again, since the sinusoid has a zero average value, no deleterious phase error buildup will occur. The resultant demodulation can take place at the frequency $f_0$ and can also include additional signals from harmonics of $f_0$. FIG. 10a shows a square wave bias waveform which provides higher signal recovery. Here each half of the square wave, 71 and 73, each provide a cycle of the rotating moments, in opposite directions. Thus the duration T is nominally equal to $1/\gamma B_{1y}'$. Since the waveform is symmetrical, no erroneous phase accrual can take place. The resultant signals are shown in FIGS. 10b and c. If, as in b, the signal begins as a cosine wave 74, when it is rewound, as in 75, it will maintain the same waveform. If it begins as a sine wave 76, as in c, it will reverse in polarity as in 77. If it is desired to demodulate both halves of the signal, a change in demodulation is required as will be shown in FIG. 11. The retrace interval 72 can occupy a relatively long portion of the waveform. To minimize this transition interval, as before, each half of the square wave can correspond to a few cycles rather than 1 cycle. Thus T is a multiple of $1/\gamma B_{1y}'$.

Figure 10C:
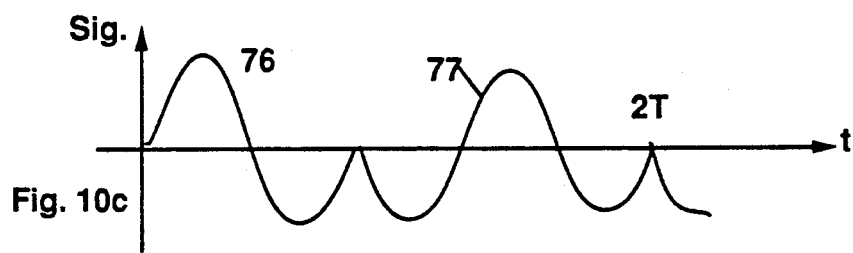
Figure 11:
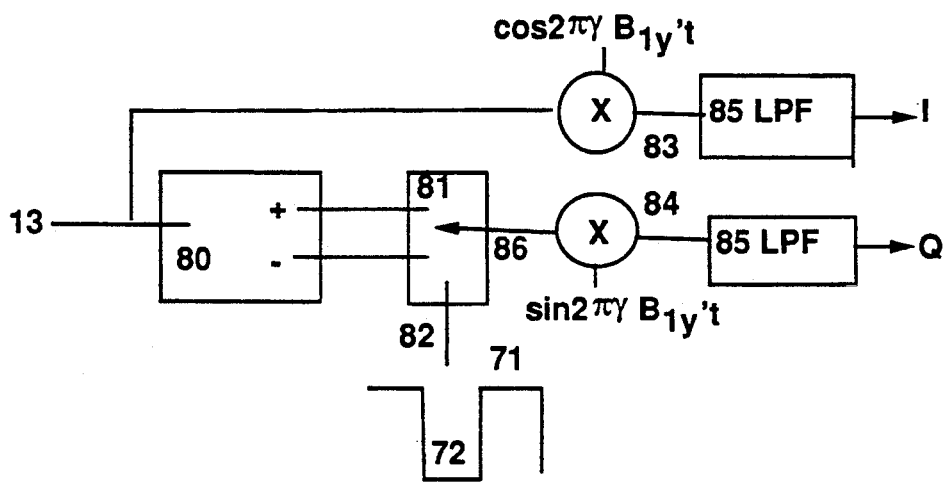
FIG. 11 is a schematic diagram illustrating an alternate demodulation system.

FIG. 11 illustrates a method of demodulating the signals produced by the square wave. Signal 13 is applied to demodulator 83 and to phase splitter 80. The polarity is determined by the square wave 82 with intervals 71 and 72 which controls switch 81. Switch 81 causes the sinusoidal component of the signal 86, as illustrated in FIG. 10c, to be coherent by reversing alternate cycles. This coherent sinusoid is then applied to sine demodulator 84. Demodulators 83 and 84, along with low pass filters 85, provide the I and Q signals in conventional fashion. These are decoded in DFT 28 to provide the desired image. The demodulation system shown can be used with any symmetrical bias waveform, including the sinusoid of FIG. 9.

Figure 12A:
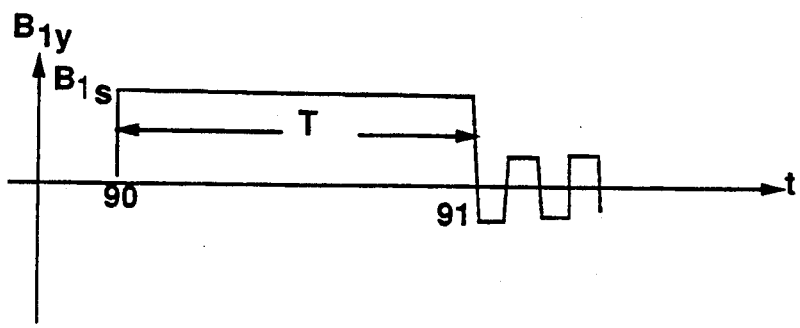
FIG. 12a is a graph illustrating a bias waveform used in a fat-water separation.
Figure 12B:
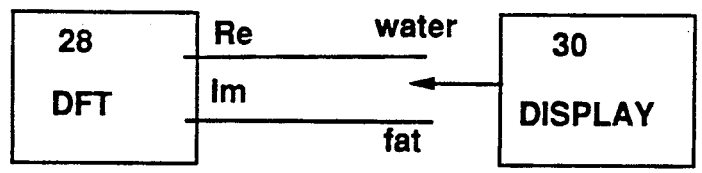
FIG. 12b is a schematic diagram illustrating a processing system of fat-water separation.

The oscillatory bias system as shown is robust to both inhomogeniety and chemical shift and will therefore treat water and fat signals in an essentially identical fashion despite their frequency difference. In some cases, however, it is desired to have separate images of water and fat. This can be accomplished as shown in FIG. 12a. Here a static rf bias waveform $B_{1s}$ is applied prior to the onset of the oscillatory waveform. It is initiated at time 90, following polarizing pulse 19, and held for time T, ¼ cycle of the difference frequency between fat and water. Thus at time 91, when the locking oscillatory bias is initiated, the two signals are 90 degrees out of phase. The separation mechanism is shown in FIG. 12b using the real and imaginary outputs from the 2DFT image decoder 28. These then become the water and fat signals. Either can be displayed in display 30 using switch 92.

Figure 13:
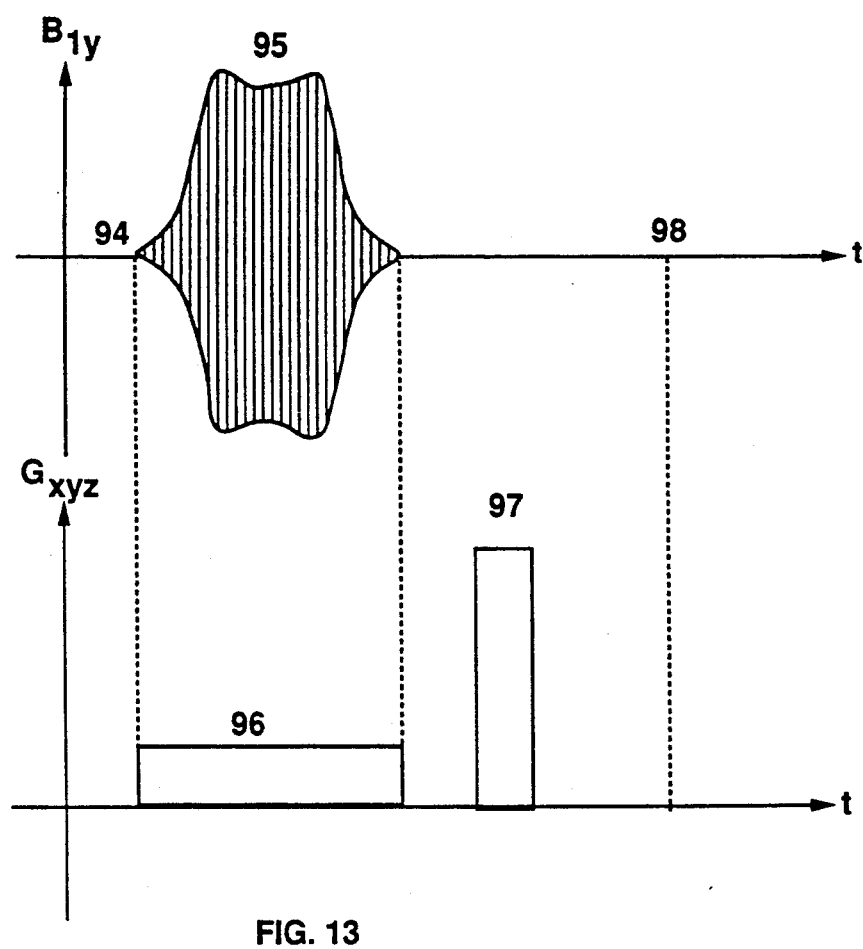
FIG. 13 is a set of graphs illustrating a method of spatial selection.

The methods shown thusfar use 3D gradient scans to image the entire volume. Often it is desired to limit the field of view to a single slice or section and make a 2D image. Also, it is often desired, in 3D imaging, to limit the field size to avoid aliasing. Some field limiting can be done using the polarizing field and/or the rf pickup coils. It is often more desirable to provide a better defined limit on the volume. This can be done, as shown in FIG. 13, using spatially selective pre-saturation. At time 94, following polarizing pulse 19, rf excitation pulse is applied along with gradient pulse 96. Unlike the previous gradient waveforms, this is a $B_0$ gradient representing a static magnetic field pointing in the z direction having variations in any of the three axes. These gradients can be realized, for example, by applying an additional set of gradient coils 12 having their axes pointing in z. The rf spectrum of 95, and gradient 96, are chosen so as to provide substantially 90 degree excitation for all of the undesired regions of volume 10. For example, if a slice or slab in z is desired, the spectrum of the pulse would approximate the transform of the difference between a large rectangular function and a narrow rectangular function representing the desired slice. The gradient 96 would be in the z direction. Once the undesired moments are tipped into the transverse plane, they are saturated using gradient 97, which can also be in the z direction, which induces large intravoxel phase shifts, thus cancelling those signals. Following this saturation sequence, at time 98, the previously described imaging operations using the rotating moments is initiated. Only the unsaturated moments will participate in this operation. Gradients in any axis can be used to provide a slab in any direction. Also, the sequence of FIG. 13 can be repeated using different gradient directions to isolate a cube in a 3D space. Here, following pulse 98, the sequence is repeated one or more times using different gradient dimensions.

I claim:

1. In a method for imaging the magnetic moment density in an object the steps of:
   polarizing the magnetic moments with a pulsed magnetic field;
   spatially selectively rotating the magnetic moments using radio frequency gradient fields pointing normal to the pulsed magnetic field;
   receiving signals from the rotating magnetic moments; and
   processing the received signals to form an image of the object.

2. The method as described in claim 1 including the step of applying a radio frequency bias field in the same direction as the gradient field and including the step of cyclically reversing the phase of the bias field to provide immunity to inhomogeniety.

3. The method as described in claim 2 where the step of processing the received signals includes the step of demodulating the received signals using a signal derived from the cyclical reversal of the phase of the bias field.

4. The method as described in claim 1 including the step of applying a static magnetic field following the pulsed field.

5. In a method for imaging the magnetic moment density in an object the steps of:
   polarizing the magnetic moments with a first magnetic field;
   spatially selectively rotating the magnetic moments using radio frequency gradient fields pointing normal to the first magnetic field;
   applying a radio frequency bias field in the same direction as the gradient field and including the step of cyclically reversing the phase of the bias field to provide immunity to inhomogeniety;
   receiving signals from the rotating magnetic moments; and
   processing the received signals to form an image of the object.

6. The method as described in claim 5 where the step of processing the received signals includes the step of demodulating the received signals using a signal derived from the cyclical reversal of the phase of the bias field.

7. Apparatus for imaging the magnetic moment density in an object comprising:
   means for polarizing the magnetic moments with a pulsed magnetic field;
   means for spatially selectively rotating the magnetic moments using radio frequency gradient fields pointing normal to the pulsed magnetic field;
   means for receiving signals from the rotating magnetic moments; and
   means for processing the received signals to form an image of the object.

8. Apparatus as described in claim 7 including means for applying a static magnetic field following the pulsed field having the same direction as the pulsed field.

9. Apparatus as described in claim 8 where the static magnetic field means is a permanent magnet.

10. Apparatus as described in claim 8 where the static magnetic field means and pulsed field means are combined into a single electromagnet whose field is increased prior to receiving signals and then decreased to its static value when receiving signals.

11. Apparatus for imaging the magnetic moment density in an object comprising:
    means for polarizing the magnetic moments with a first magnetic field;
    means for spatially selectively rotating the magnetic moments using radio frequency gradient fields pointing normal to the first magnetic field;
    means for applying a radio frequency bias field in the same direction as the gradient field and means for cyclically reversing the phase of the bias field to provide immunity to inhomogeniety;
    means for receiving signals from the rotating magnetic moments; and
    means for processing the received signals to form an image of the object.

12. Apparatus as described in claim 11 where the means for cyclically reversing the phase of the bias field includes using a periodic waveform whose frequency is substantially the product of the gyromagnetic ratio and amplitude of the bias field.

13. Apparatus as described in claim 11 where the means for cyclically reversing the phase of the bias field includes using a periodic waveform whose frequency is substantially a sub-multiple of the product of the gyromagnetic ratio and amplitude of the bias field.

14. Apparatus as described in claim 11 where the means for cyclically reversing the phase of the bias field includes means for modulating the amplitude of the bias field with a waveform having a zero average value.

15. Apparatus as described in claim 11 where the means for cyclically reversing the phase of the bias field includes means for modulating the amplitude of the bias field with a waveform which has a trace interval during which received signals are acquired and a retrace interval, substantially shorter than the trace interval, during which the phase of the bias field returns to its value at the start of the trace interval.

16. Apparatus as described in claim 11 where the means for cyclically reversing the phase of the bias field includes means for modulating the amplitude of the bias field with a symmetrical waveform which has equal positive and negative excursions.

17. Apparatus as described in claim 11 where the means for cyclically reversing the phase of the bias field includes means for modulating the amplitude of the bias field with a waveform which is substantially a square wave.

18. Apparatus as described in claim 11 where the means for cyclically reversing the phase of the bias field includes means for modulating the amplitude of the bias field with a waveform which is substantially a sine wave.

19. Apparatus as described in claim 11 where the means for processing the received signals includes means for synchronously demodulating the received signals at a frequency substantially equal to the product of the gyromagnetic ratio and the amplitude of the bias field.

20. Apparatus as described in claim 17 where the means for processing the received signals includes means for alternating the polarity of the received signal during each half of the square wave to form a sine signal and including means for demodulating the sine signal.

21. Apparatus for imaging the magnetic moment density in an object comprising:
means for polarizing the magnetic moments with a pulsed magnetic field;
means for spatially selectively rotating the magnetic moments using radio frequency gradient fields pointing normal to the first magnetic field;
means for receiving signals from the rotating magnetic moments using two receiving coils in substantial spatial quadrature relationship to each other; and
means for processing the received signals to form an image of the object.

22. Apparatus as described in claim 21 where one of the two receiving coils is also used to polarize the magnetic moments.

23. Apparatus as described in claim 21 where the receiving means includes a first coil whose axis is parallel to the polarizing means and a second coil normal to the first coil which receives an amplitude modulated precessing signal and where the processing means includes means for recovering the amplitude modulation.

24. Apparatus as described in claim 23 where the means for recovering the amplitude modulation includes a magnitude detector and a polarity selector controlled by a phase-sensitive detector.

25. Apparatus as described in claim 11 including means for separating the water and fat components of the object including means for applying a constant amplitude rf bias field for a time interval based on the period of the difference frequency between the water and fat gyromagnetic ratios multiplied by the amplitude of the bias field resulting in a phase difference between water and fat signals and processing means for detecting the resultant phase difference between water and fat.

26. Apparatus as described in claim 11 including means for selectively insensitizing undesirable portions of the object comprising means for applying a static magnetic gradient field prior to receiving signals and means for applying a radio frequency excitation field during the time of the static gradient field to saturate the magnetic moments in undesirable portions of the object.

* * * * *